United States Patent
Haraguchi

(10) Patent No.: US 11,309,394 B2
(45) Date of Patent: Apr. 19, 2022

(54) SEMICONDUCTOR MEMORY DEVICE, MEMORY SYSTEM, AND DEFECT DETECTION METHOD

(71) Applicant: KIOXIA CORPORATION, Minato-ku (JP)

(72) Inventor: Shinya Haraguchi, Yokohama (JP)

(73) Assignee: KIOXIA CORPORATION, Minato-ku (JP)

( * ) Notice: Subject to any disclaimer, the term of this patent is extended or adjusted under 35 U.S.C. 154(b) by 102 days.

(21) Appl. No.: 16/562,771

(22) Filed: Sep. 6, 2019

(65) Prior Publication Data
US 2020/0258993 A1    Aug. 13, 2020

(30) Foreign Application Priority Data
Feb. 13, 2019  (JP) .............................. JP2019-023220

(51) Int. Cl.
*G11C 16/00* (2006.01)
*H01L 29/423* (2006.01)
*G11C 13/00* (2006.01)
*H01L 23/522* (2006.01)
*G11C 16/04* (2006.01)
(Continued)

(52) U.S. Cl.
CPC ...... *H01L 29/42324* (2013.01); *G11C 13/004* (2013.01); *G11C 13/0026* (2013.01); *G11C 13/0069* (2013.01); *G11C 16/0483* (2013.01); *G11C 16/14* (2013.01); *G11C 29/44* (2013.01); *H01L 23/5222* (2013.01); *G11C 2013/0054* (2013.01)

(58) Field of Classification Search
CPC . G11C 29/44; G11C 16/0483; G11C 16/3418; G11C 16/3422
See application file for complete search history.

(56) References Cited

U.S. PATENT DOCUMENTS

| 5,606,527 A | 2/1997 | Kwack et al. |
| 8,902,657 B2 | 12/2014 | Iwai et al. |
| 9,396,775 B2 | 7/2016 | Shirakawa et al. |
| (Continued) | | |

FOREIGN PATENT DOCUMENTS

| JP | 2014-053061 A | 3/2014 |
| JP | 2015-036999 A | 2/2015 |
| (Continued) | | |

*Primary Examiner* — Alfredo Bermudez Lozada
(74) *Attorney, Agent, or Firm* — Oblon, McClelland, Maier & Neustadt, L.L.P.

(57) ABSTRACT

A semiconductor memory device includes: a first wiring and a second wiring; a first selection transistor, a memory transistor, and a second selection transistor connected between the first wiring and the second wiring; and a third wiring and a fourth wiring connected to gate electrodes of the first selection transistor and the second selection transistor. From a first timing to a second timing, a first voltage that turns the first selection transistor ON is supplied to the third wiring, and a second voltage that turns the second selection transistor OFF is supplied to the fourth wiring. From the second timing to a third timing, a third voltage that turns the first selection transistor OFF is supplied to the third wiring, and at a fourth timing between the first timing and the third timing, at least one of a voltage and a current of the first wiring is detected.

6 Claims, 17 Drawing Sheets

(51) Int. Cl.
*G11C 29/44* (2006.01)
*G11C 16/14* (2006.01)

(56) References Cited

U.S. PATENT DOCUMENTS

| | | |
|---|---|---|
| 10,248,560 B2 | 4/2019 | Ohno et al. |
| 2012/0294093 A1* | 11/2012 | Yang .................. G11C 16/26 365/185.22 |
| 2015/0049549 A1 | 2/2015 | Asaoka |

FOREIGN PATENT DOCUMENTS

| | | |
|---|---|---|
| JP | 2015-176309 A | 10/2015 |
| JP | 2018-055673 A | 4/2018 |

* cited by examiner

US 11,309,394 B2

SEMICONDUCTOR MEMORY DEVICE, MEMORY SYSTEM, AND DEFECT DETECTION METHOD

CROSS-REFERENCE TO RELATED APPLICATIONS

This application is based upon and claims the benefit of Japanese Patent Application No. 2019-023220, filed on Feb. 13, 2019, the entire contents of which are incorporated herein by reference.

BACKGROUND

Field

Embodiments described herein relate generally to a semiconductor memory device, a memory system, and a defect detection method.

Description of the Related Art

There has been known a semiconductor memory device including a first wiring and a second wiring, a memory transistor connected between the first wiring and the second wiring, a first selection transistor connected between the first wiring and the memory transistor, a second selection transistor connected between the second wiring and the memory transistor, a third wiring connected to a gate electrode of the first selection transistor, and a fourth wiring connected to a gate electrode of the second selection transistor.

DETAILED DESCRIPTION

Figure 1:
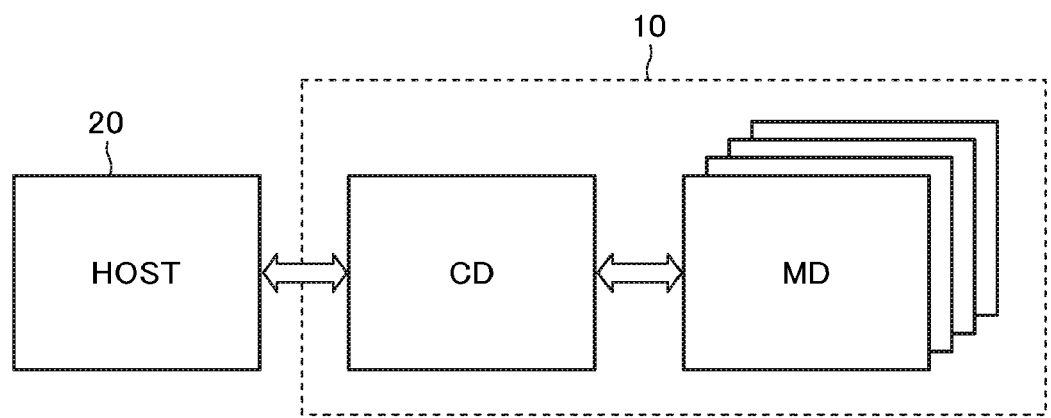
FIG. 1 is a schematic block diagram illustrating a configuration of a memory system 10.

A semiconductor memory device according to one embodiment includes a first wiring and a second wiring, a memory transistor connected between the first wiring and the second wiring, a first selection transistor connected between the first wiring and the memory transistor, a second selection transistor connected between the second wiring and the memory transistor, a third wiring connected to a gate electrode of the first selection transistor, and a fourth wiring connected to a gate electrode of the second selection transistor. From a first timing to a second timing, a first voltage that turns the first selection transistor ON is supplied to the third wiring, and a second voltage that turns the second selection transistor OFF is supplied to the fourth wiring. From the second timing to a third timing, a third voltage that turns the first selection transistor OFF is supplied to the third wiring. At a fourth timing between the first timing and the third timing, at least one of a voltage and a current of the first wiring is detected.

A defect detection method for a semiconductor memory device according to one embodiment is a defect detection method for a semiconductor memory device that includes a first wiring and a second wiring, a memory transistor connected between the first wiring and the second wiring, a first selection transistor connected between the first wiring and the memory transistor, a second selection transistor connected between the second wiring and the memory transistor, a third wiring connected to a gate electrode of the first selection transistor, and a fourth wiring connected to a gate electrode of the second selection transistor. This method includes: from a first timing to a second timing, supplying a first voltage that turns the first selection transistor ON to the third wiring and supplying a second voltage that turns the second selection transistor OFF to the fourth wiring; from the second timing to a third timing, supplying a third voltage that turns the first selection transistor OFF to the third wiring; and at a fourth timing between the first timing and the third timing, detecting at least one of a voltage and a current of the first wiring.

Next, semiconductor memory devices according to embodiments will be described in detail with reference to the accompanying drawings. Here, the following embodiments are only examples, and are not described for the purpose of limiting the present invention.

In this specification, when referring to "the semiconductor memory device", it may mean a memory die or may mean a memory system including a control die, such as a memory chip, a memory card, and an SSD. Further, it may mean a configuration including a host computer such as a smartphone, a tablet terminal, and a personal computer.

In this specification, when referring to that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even if the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

[Semiconductor Memory Device]

FIG. 1 is a schematic block diagram illustrating a configuration of a memory system 10 according to a first embodiment.

The memory system 10, for example, reads, writes, and erases user data corresponding to a signal transmitted from a host computer 20. The memory system 10 is any system configured to store the user data, such as a memory chip, a memory card, and an SSD. The memory system 10 includes a plurality of memory dies MD that store the user data, and a control die CD connected to the plurality of memory dies MD and the host computer 20. The control die CD includes, for example, a processor, a RAM, a ROM, and an ECC circuit, and performs conversion between a logical address and a physical address, bit error detection/correction, a wear leveling, and similar process.

Figure 2:
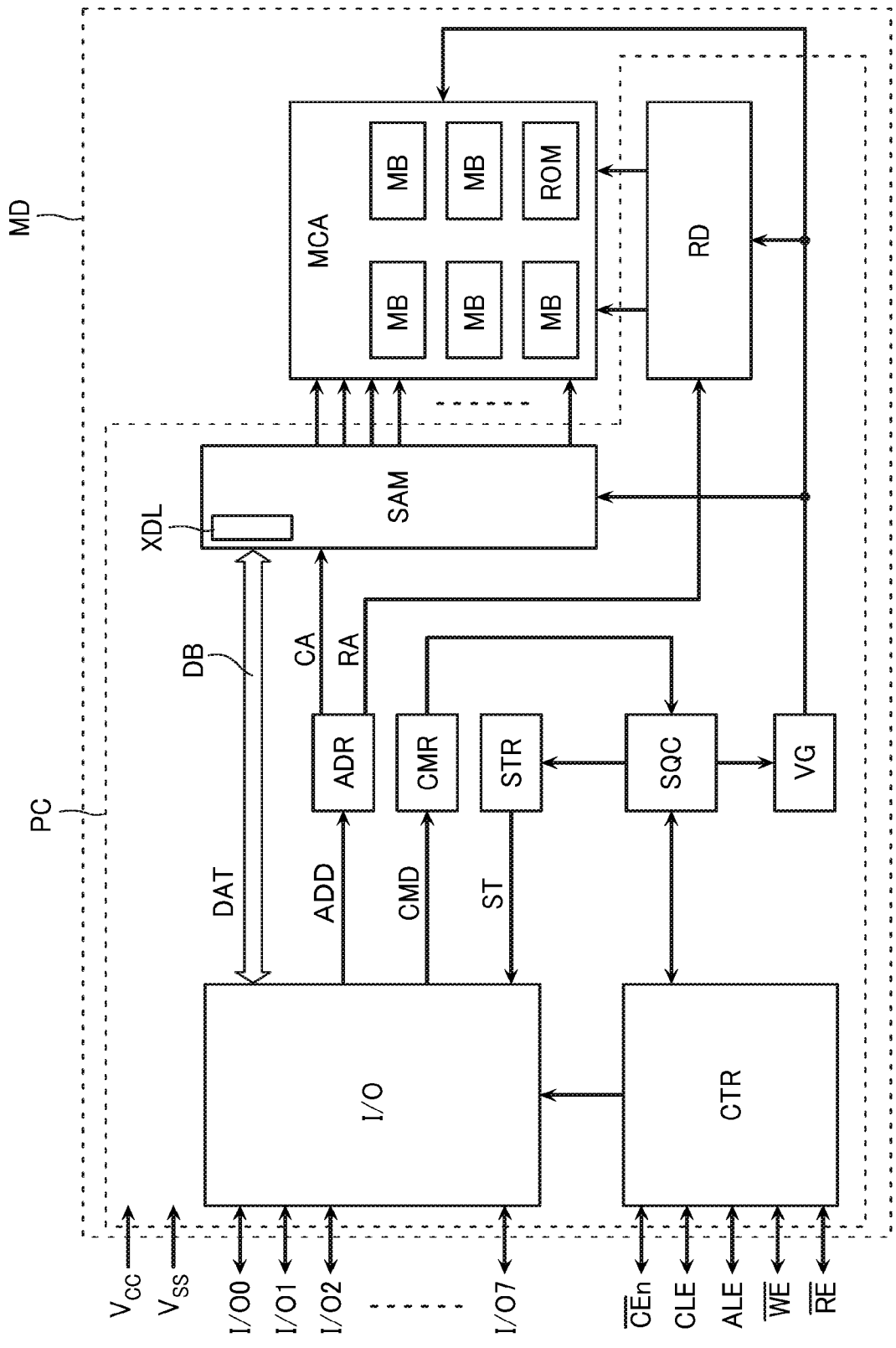
FIG. 2 is a schematic block diagram illustrating a configuration of a memory die MD.
Figure 3:
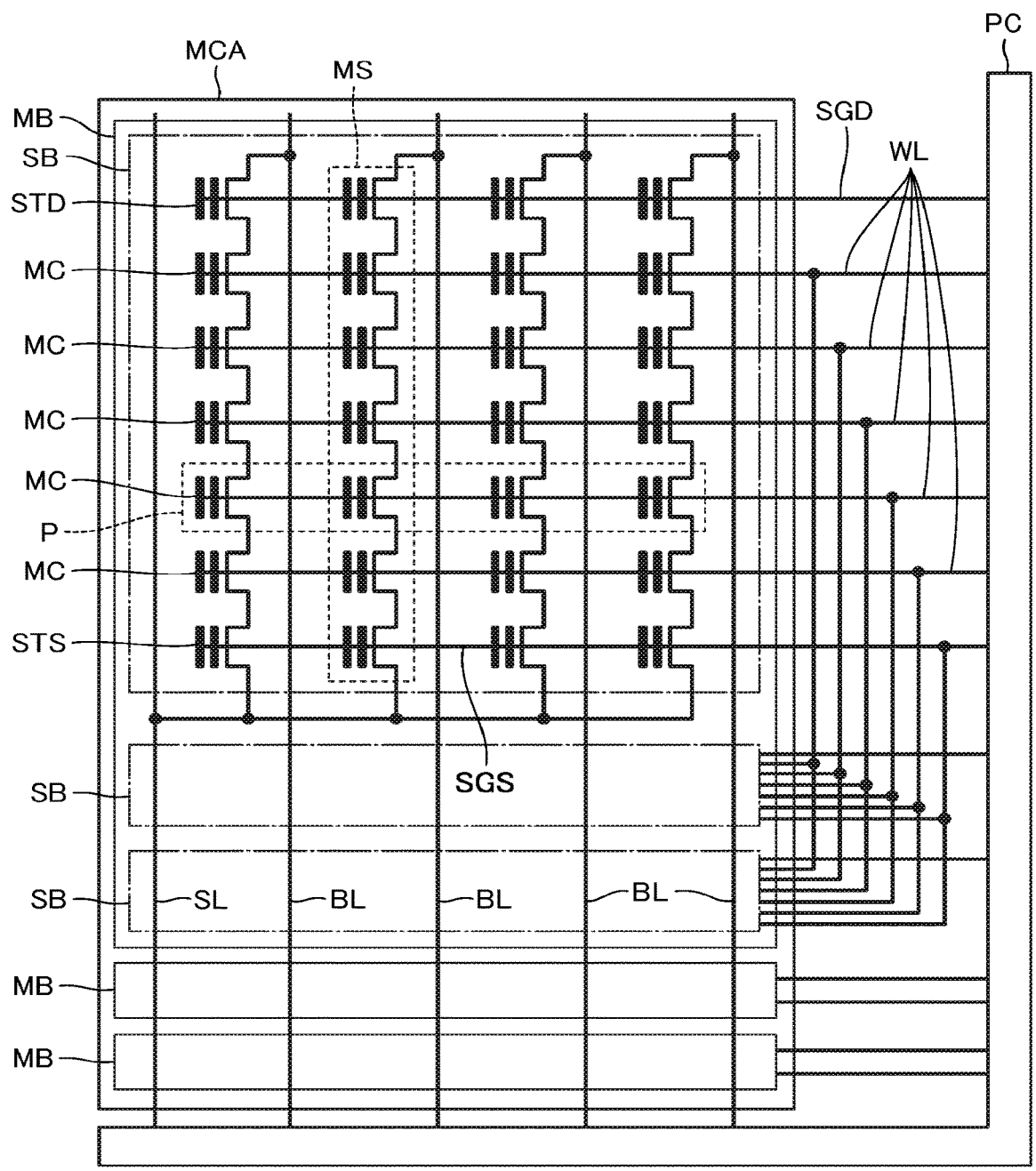
FIG. 3 is a schematic circuit diagram illustrating a configuration of a memory cell array MCA.
Figure 4:
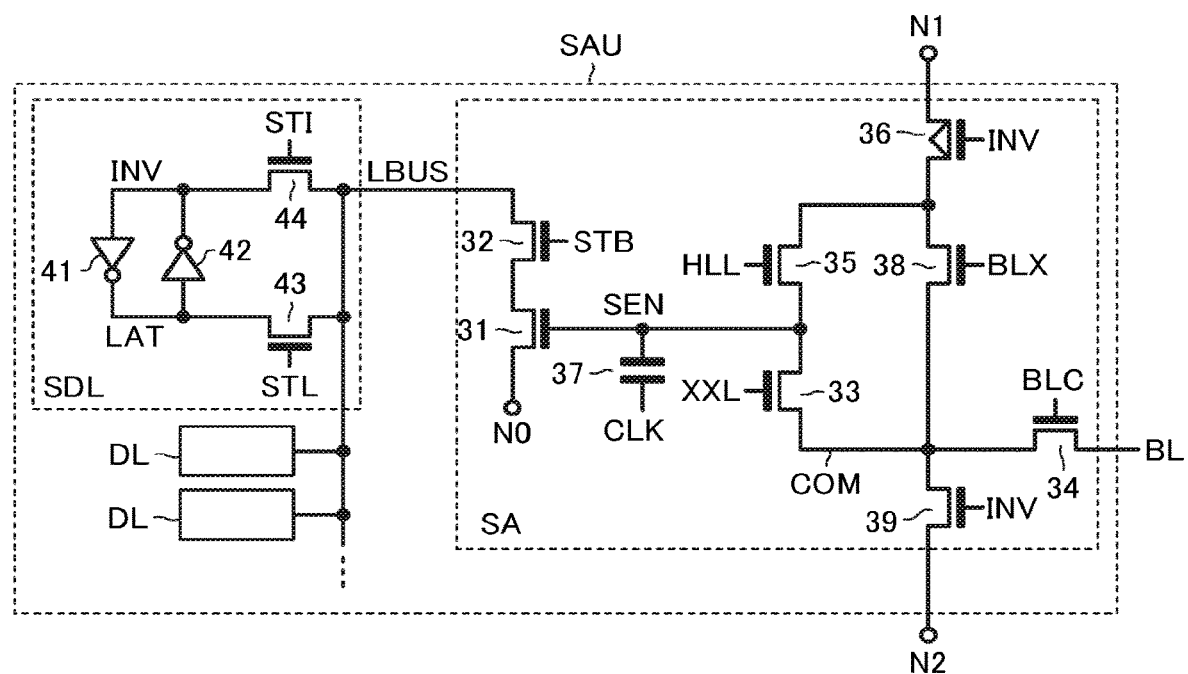
FIG. 4 is a schematic circuit diagram illustrating a configuration of a sense amplifier SA.

FIG. 2 is a schematic block diagram illustrating a configuration of the memory die MD according to the first embodiment. FIG. 3 and FIG. 4 are schematic circuit diagrams illustrating configurations of parts of the memory die MD.

As illustrated in FIG. 2, the memory die MD includes a memory cell array MCA that stores data and a peripheral circuit PC connected to the memory cell array MCA.

[Memory Cell Array MCA]

The memory cell array MCA includes a plurality of memory blocks MB. The memory blocks MB record user data and the like. A part of the memory cell array MCA is used as a ROM region. The ROM region records a parameter, such as a voltage value used for controlling the memory die MD, a block address of a defective block, and other data used for controlling the memory die MD.

The memory blocks MB each include a plurality of subblocks SB as illustrated in FIG. 3. These plurality of subblocks SB each include a plurality of memory strings MS. These plurality of memory strings MS have one ends each connected to the peripheral circuit PC via a bit line BL. These plurality of memory strings MS have other ends each connected to the peripheral circuit PC via a common source line SL.

The memory string MS includes a drain selection transistor STD, a plurality of memory cells MC, and a source selection transistor STS, which are connected in series between the bit line BL and the source line SL. Hereinafter, the drain selection transistor STD and the source selection transistor STS may be simply referred to as selection transistors (STD, STS).

The memory cell MC according to the embodiment is a field-effect type transistor (memory transistor) including a semiconductor layer that functions as a channel region, a gate insulating film including an electric charge accumulating film, and a gate electrode. The memory cell MC has a threshold voltage that varies corresponding to an electric charge amount in the electric charge accumulating film. The memory cell MC stores data of one bit or a plurality of bits.

The respective gate electrodes of the plurality of memory cells MC corresponding to one memory string MS are connected to word lines WL. These respective word lines WL are commonly connected to all the memory strings MS in one memory block MB. Hereinafter, the plurality of memory cells MC included in one subblock SB and commonly connected to one word line WL are referred to as a "page P".

The selection transistor (STD, STS) is a field-effect type transistor including a semiconductor layer that functions as a channel region, a gate insulating film, and a gate electrode. The respective gate electrodes of the selection transistors (STD, STS) are connected to selection gate lines (SGD, SGS). The drain selection line SGD is disposed corresponding to the subblock SB and commonly connected to all the memory strings MS in one subblock SB. The source selection line SGS is commonly connected to the plurality of memory strings MS in one memory block MB.

[Peripheral Circuit PC]

As illustrated in FIG. 2, the peripheral circuit PC includes a row decoder RD, a sense amplifier module SAM, a voltage generation circuit VG, and a sequencer SQC. The peripheral circuit PC includes an address register ADR, a command register CMR, and a status register STR. The peripheral circuit PC includes an input/output control circuit I/O and a logic circuit CTR.

The row decoder RD includes, for example, a decode circuit and a switch circuit. The decode circuit decodes a row address RA latched onto the address register ADR. The switch circuit electrically conducts the word line WL and the selection gate line (SGD, SGS) corresponding to the row address RA with corresponding voltage supply lines in accordance with an output signal of the decode circuit.

The sense amplifier module SAM includes a plurality of sense amplifier units SAU corresponding to a plurality of bit lines BL. The sense amplifier unit SAU includes a sense amplifier SA connected to the bit line BL, data latch SDL, a plurality of data latches DL, a logic circuit (not illustrated), and a wiring LBUS connected to these components as illustrated in FIG. 4.

As illustrated in FIG. 4, the sense amplifier SA includes a sense transistor 31 that discharges electric charge of the wiring LBUS corresponding to a current and the like flowing through the bit line BL. The sense transistor 31 has a source electrode connected to a node N0, a drain electrode, and a gate electrode. The drain electrode is connected to the wiring LBUS via a switch transistor 32. The gate electrode is connected to the bit line BL via a sense node SEN, a discharge transistor 33, a node COM, and a clamp transistor 34. The sense node SEN is connected to a node N1 via a charge transistor 35 and a charge transistor 36, and connected to an internal control signal CLK via a capacitor 37. The node COM is connected to the node N1 via a charge transistor 38 and the charge transistor 36, and connected to a node N2 via a discharge transistor 39.

The sense transistor 31, the switch transistor 32, the discharge transistor 33, the clamp transistor 34, the charge transistor 35, the charge transistor 38, and the discharge transistor 39 are, for example, NMOS transistors. The charge transistor 36 is, for example, a PMOS transistor.

The data latch SDL includes nodes LAT and INV, inverters 41 and 42 connected to the nodes LAT and INV in parallel, a switch transistor 43 connected to the node LAT and the wiring LBUS, and a switch transistor 44 connected to the node INV and the wiring LBUS. The switch transistors 43 and 44 are, for example, the NMOS transistors.

The sense amplifier module SAM includes a decode circuit and a switch circuit (not illustrated). The decode circuit decodes a column address CA latched in the address register ADR (FIG. 2). The switch circuit electrically conducts a data latch XDL corresponding to the column address CA with a bus DB, in accordance with an output signal of the decode circuit.

The voltage generation circuit VG (FIG. 2) includes, for example, a step up circuit such as a charge pump circuit connected to a power supply terminal and a grounding terminal, a step down circuit, and a plurality of voltage supply lines (not illustrated). The voltage generation circuit VG generates a plurality of operating voltages applied to the bit line BL, the source line SL, the word line WL, and the selection gate lines (SGD, SGS) to simultaneously output the plurality of operating voltages from the plurality of voltage supply lines, in a read operation, a write operation, and an erase operation for the memory cell array MCA, in response to an internal control signal from the sequencer SQC.

The sequencer SQC sequentially decodes command data CMD latched in the command register CMR to output the internal control signal to the row decoder RD, the sense amplifier module SAM, and the voltage generation circuit VG. The sequencer SQC outputs status data indicating its own state to the status register STR as necessary. For example, in executing the write operation or the erase operation, information indicative of whether the write operation or the erase operation has been normally ended or not is output as the status data.

The input/output control circuit I/O includes data input/output terminals I/O0 to I/O7, a shift register connected to these data input/output terminals I/O0 to I/O7, and a FIFO buffer connected to this shift register. The input/output control circuit I/O outputs data input from the data input/output terminals I/O0 to I/O7 to the data latch XDL in the sense amplifier module SAM, the address register ADR, or the command register CMR, in accordance with the internal control signal from the logic circuit CTR. The input/output control circuit I/O outputs the data input from the data latch XDL or the status register STR to the data input/output terminals I/O0 to I/O7.

The logic circuit CTR receives an external control signal from the control die CD via external control terminals/CEn, CLE, ALE, /WE, and /RE to output the internal control signal to the input/output control circuit I/O in accordance with this.

Figure 5:
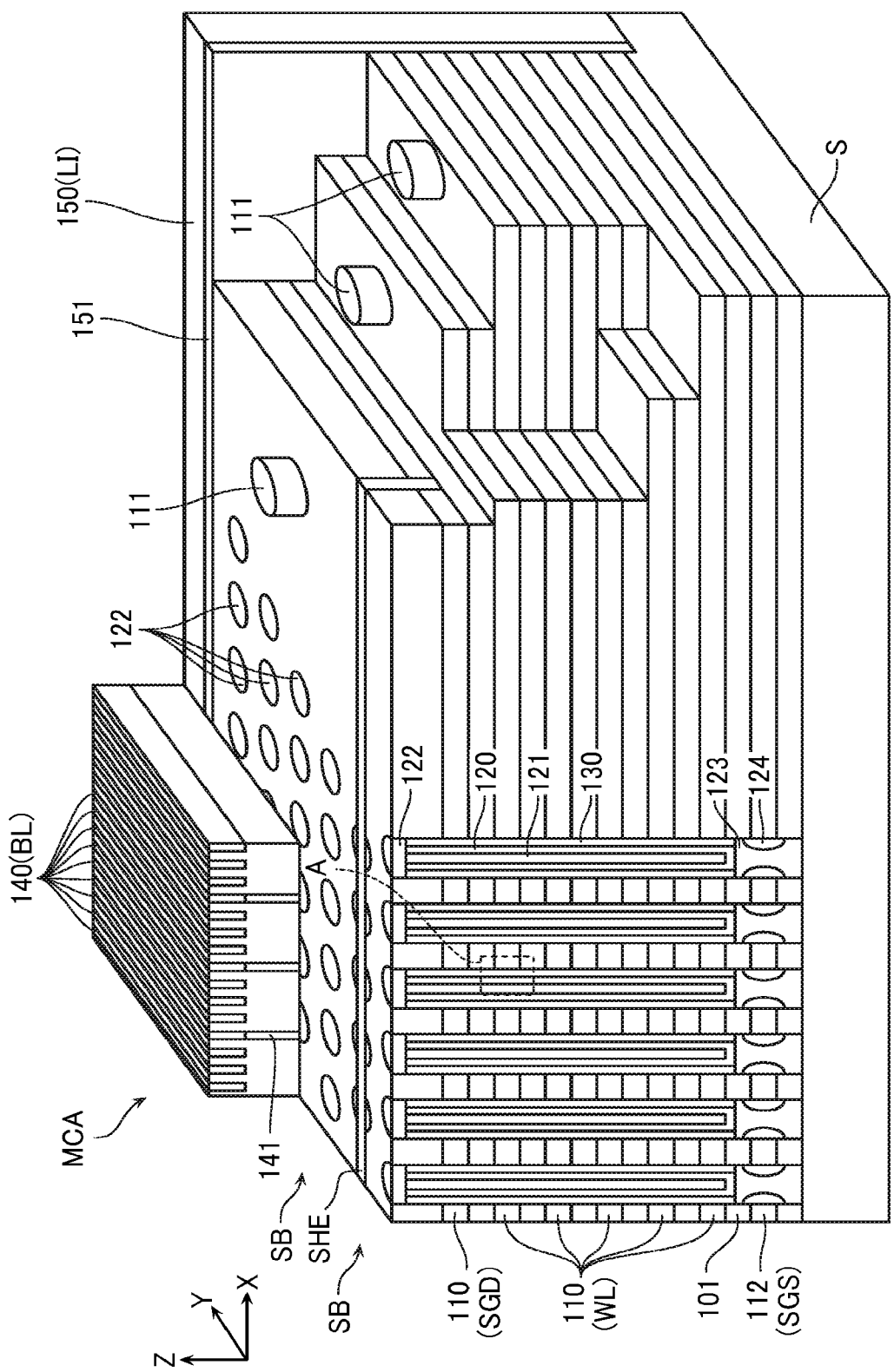
FIG. 5 is a schematic perspective view illustrating the configuration of the memory cell array MCA.

Next, with reference to FIG. 5, a configuration of the memory cell array MCA according to the embodiment is briefly described. For sake of convenient description, a part of configuration is omitted in FIG. 5.

As illustrated in FIG. 5, the semiconductor memory device according to the embodiment includes a substrate S, a plurality of conducting layers 110 arranged in a Z direction, a plurality of semiconductor layers 120 that extends in the Z direction and is opposed to the plurality of conducting layers 110, a gate insulating film 130 disposed between the conducting layer 110 and the semiconductor layer 120, a plurality of conducting layers 140 connected to an upper end portion of the semiconductor layers 120, and a conducting layer 150 connected to a top surface of the substrate S.

The substrate S is, for example, a semiconductor substrate made of a single-crystal silicon (Si) or the like. The substrate S has, for example, an N type impurity layer of phosphorus (P) or the like on a surface of the semiconductor substrate, and further includes a double well structure having a P type impurity layer of boron (B) or the like within this N type impurity layer.

The conducting layer 110 includes, for example, a laminated film of titanium nitride (TiN) and tungsten (W) or the like. The conducting layers 110 function as, for example, gate electrodes of the word line WL (FIG. 3) and the plurality of memory cells MC connected to this word line WL, or gate electrodes of the drain selection line SGD (FIG. 3) and the plurality of drain selection transistors STD (FIG. 3) connected to this drain selection line SGD. The conducting layers 110 have end portions in an X direction connected to the peripheral circuit PC (FIG. 1) via contacts 111 extending in the Z direction.

Between the conducting layer 110 and the substrate S, a conducting layer 112 is disposed. The conducting layer 112 includes, for example, a laminated film or the like of titanium nitride (TiN) and tungsten (W). The conducting layer 112 functions as gate electrodes of the source selection line SGS (FIG. 1) and the plurality of source selection transistors STS (FIG. 1) connected to this source selection line SGS.

Between the plurality of conducting layers 110 neighboring in the Z direction, between the conducting layer 110 and the conducting layer 112, and between the conducting layer 112 and the substrate S, insulating layers 101 of silicon oxide ($SiO_2$) or the like are disposed. The conducting layer 110, the conducting layer 112, and the insulating layer 101 have a plurality of through-holes formed in a predetermined pattern, and this through-hole has an inner peripheral surface opposed to an outer peripheral surface of the semiconductor layer 120.

The semiconductor layer 120 functions as a channel region of the plurality of memory cells MC and the drain selection transistor STD included in one memory string MS (FIG. 3). The semiconductor layer 120 has an approximately cylindrical shape extending in the Z direction. The semiconductor layer 120 is, for example, a semiconductor layer of non-doped polycrystalline silicon (Si) or the like. The semiconductor layer 120 has a center portion into which an insulating layer 121 of silicon oxide ($SiO_2$) or the like is implanted. The semiconductor layer 120 has an upper end portion connected to the conducting layer 140 via a semiconductor layer 122 and a conducting layer 141. The semiconductor layer 122 is, for example, a conductive semiconductor film into which n-type impurities of, for example, phosphorus (P) is injected. The semiconductor layer 120 has a lower end portion connected to a semiconductor layer 123.

The semiconductor layer 123 functions as a channel region of the source selection transistor STS. The semiconductor layer 123 is, for example, a semiconductor layer of non-doped single-crystal silicon (Si) or the like. Between an outer peripheral surface of the semiconductor layer 123 and an inner peripheral surface of the through-hole disposed in the conducting layer 112, a gate insulating film 124 is disposed.

Figure 6:
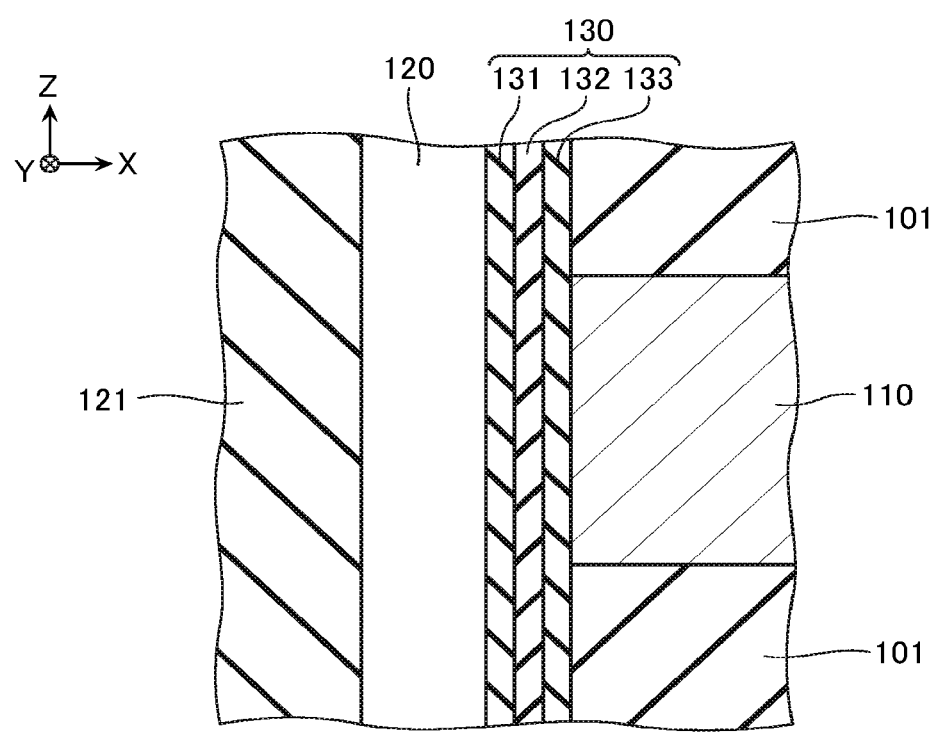
FIG. 6 is an enlarged view of a part of FIG. 5.

The gate insulating film 130 has an approximately cylindrical shape that covers the outer peripheral surface of the semiconductor layer 120. The gate insulating film 130, for example, as illustrated in FIG. 6, includes a tunnel insulating film 131, an electric charge accumulating film 132, and a block insulating film 133 that are disposed from a side of the semiconductor layer 120 to a side of the conducting layer 110. The tunnel insulating film 131 is, for example, an insulating film of silicon oxide ($SiO_2$) or the like. The electric charge accumulating film 132 is, for example, an insulating film of, for example, silicon nitride (SiN). The block insulating film 133 may be, for example, an insulating film of silicon oxide ($SiO_2$) or the like, or may be a laminated film having an insulation property.

The conducting layers 140, as illustrated in FIG. 5, extend in a Y direction and are aligned in the X direction. The conducting layer 140 includes, for example, a laminated film or the like of titanium nitride (TiN) and copper (Cu). The conducting layer 140 functions as a bit line BL.

The conducting layer 150 extends in the Z direction and the X direction, and is connected to the substrate S in a lower end portion. The conducting layer 150, for example, includes a laminated film or the like of titanium nitride (TiN) and tungsten (W). The conducting layer 150 functions as a source contact LI. The conducting layer 150 has a side surface in the Y direction on which an insulating layer 151 is disposed.

[Defect Detection Method]

In the semiconductor memory device described above, there is a case where a short circuit occurs between the conducting layer 110 and the semiconductor layer 120 (FIG. 5, FIG. 6) to lead to a malfunction.

For example, when the write operation into the memory cell MC is performed, a write voltage generated in the voltage generation circuit VG (FIG. 2) is supplied to the selected word line WL. However, when the conducting layer 110 functioning as the selected word line WL and the semiconductor layer 120 have a short circuit, a current flows from the conducting layer 110 to the conducting layer 140 via the semiconductor layer 120 to decrease a voltage of the conducting layer 110 to less than an intended voltage. When the write operation is performed in such a state, there is a case where a writing defect occurs in the plurality of memory cells MC connected to the selected word lines WL. When the read operation from these memory cells MC is performed, there is a case where a reading defect occurs.

Therefore, in this embodiment, in manufacturing the memory die MD, such a defect is detected during a testing stage. Hereinafter, a defect detection method according to the embodiment is exemplarily illustrated.

Figure 7:
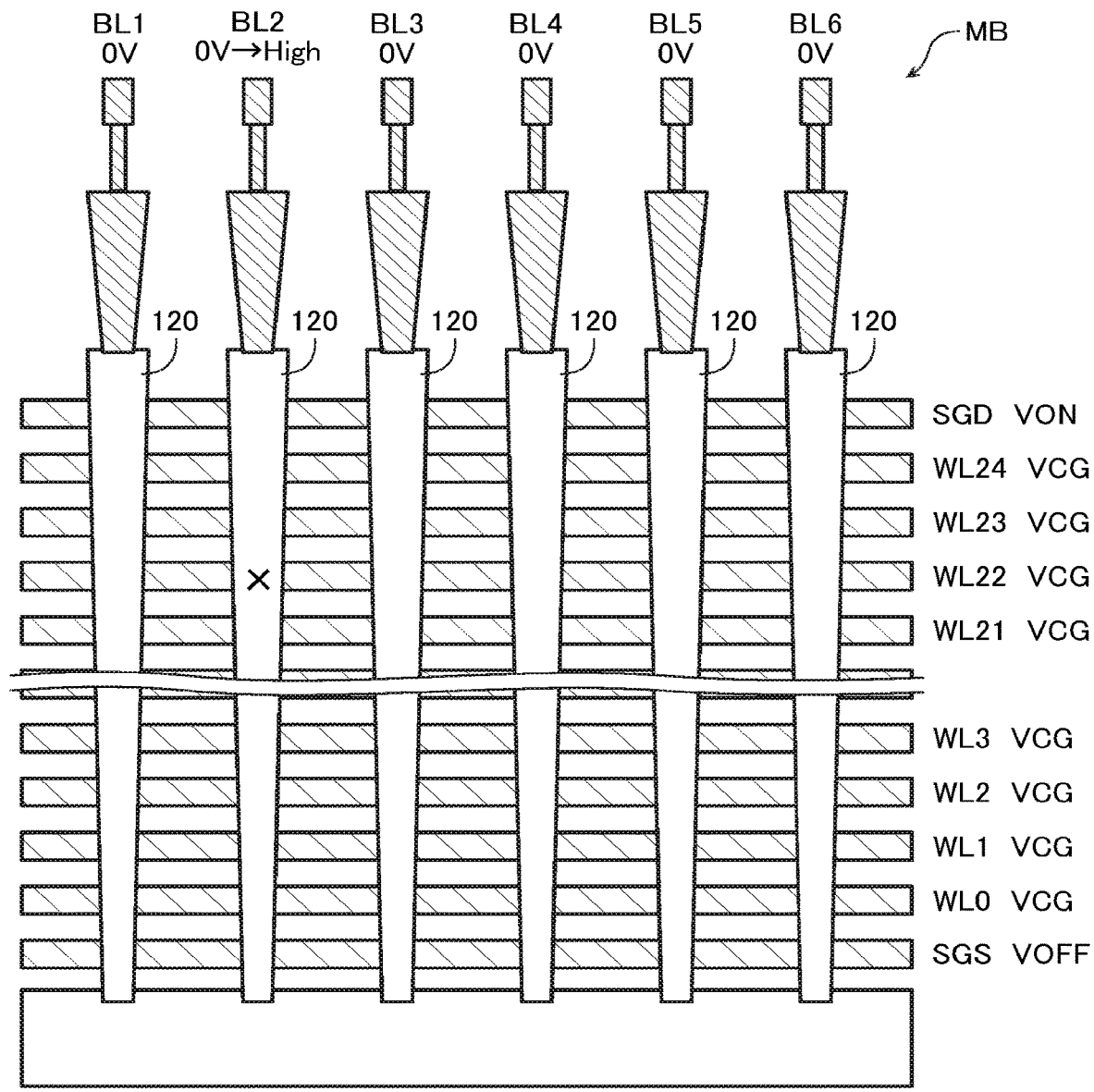
FIG. 7 is a schematic cross-sectional view for describing a defect detection method according to a first embodiment.

FIG. 7 is a schematic cross-sectional view for describing a defect detection method according to the embodiment. For sake of convenient description, a part of configuration is omitted in FIG. 7.

In FIG. 7, as the word lines WL, word lines WL0 to WL24 are exemplarily illustrated. As bit lines BL, bit lines BL1 to BL6 are exemplarily illustrated.

In the defect detection method according to the embodiment, for example, 0 V is supplied to the bit lines BL1 to BL6, a voltage VON is supplied to the drain selection line SGD, and a voltage VOFF is supplied to the source selection line SGS. The voltage VON has a magnitude to the extent that a channel of the electrons is formed in the channel region of the drain selection transistor STD. The voltage VOFF has a magnitude to the extent that a channel is not formed in the channel region of the source selection transistor STS.

In the same method, a voltage VCG is supplied to the word lines WL0 to WL24. The voltage VCG is larger than the voltage supplied to the bit lines BL1 to BL6. The voltage VCG has a magnitude to the extent that the memory cell MC turns ON.

Here, when a short circuit has occurred between the word line WL and the semiconductor layer 120 in the memory blocks MB, the current flows from the word line WL to the bit line BL via the semiconductor layer 120 to increase the voltage of the bit line BL. In the illustrated example, a short circuit between the word line WL22 and the semiconductor layer 120 corresponding to the bit line BL2 has occurred. This increases the voltage of the bit line BL2.

Next, the voltages of the bit lines BL1 to BL6 are detected. To detect the voltages, for example, a sense amplifier SA (FIG. 4) is used. For example, the wiring LBUS is charged and the node STL is turned into an "H" state, thus causing the data latch SDL to latch the "H". The nodes BLC and XXL are turned into the "H" state, the nodes HLL and BLX are turned into an "L" state, and the gate electrode of the sense transistor 31 is electrically conducted with the bit line BL. Turning the node "STB" into the "H" state to discharge or maintain the electric charge of the wiring LBUS, and turning the node STL into the "H" state detects the voltage of the bit line BL. In the example in FIG. 7, an "L" is latched to the data latch SDL corresponding to the bit line BL2, and the "H" is latched to the data latches SDL corresponding to the other bit lines BL.

Next, for example, a detection result by the sense amplifier SA is output. This detection result, for example, may be output as status data or the like, or the data latched to the data latch SDL may be directly output. When outputting as the status data, for example, in the case where the data latched to the data latch SDL includes even one "L", the status data may be output as failed, and in the case where the data latched to the data latch SDL does not include "L", the status data may be output as passed.

When a defect is detected, a block address of the memory block MB from which the defect is detected may be recorded in the ROM region (FIG. 2) of the memory cell array MCA. In the use of the memory system 10 (FIG. 1), the control die CD may detect the block address of the defective block so as not to allocate a physical address.

At a timing of detecting the voltages, the bit lines BL1 to BL6 may be electrically conducted to or may be electrically not conducted to the semiconductor layer 120. For example, the timing at which the supply of the voltage VON to the drain selection line SGD and the supply of the voltage VOFF to the source selection line SGS are started is set to be a first timing. The timing at which such supplies of voltages are terminated is set to be a second timing. From the second timing to a third timing, the voltage VOFF that turns the drain selection transistor STD OFF is applied to the drain selection line SGD. In this case, the timing at which the voltage is detected may be performed at any timing from the first timing to the third timing.

[Advantages]

With the defect detection method according to the embodiment, using the sense amplifier SA, the above-described defect detection can be efficiently performed. When outputting the data latched to the data latch SDL, the position where the defect has occurred can be easily specified.

Second Embodiment

Figure 8:
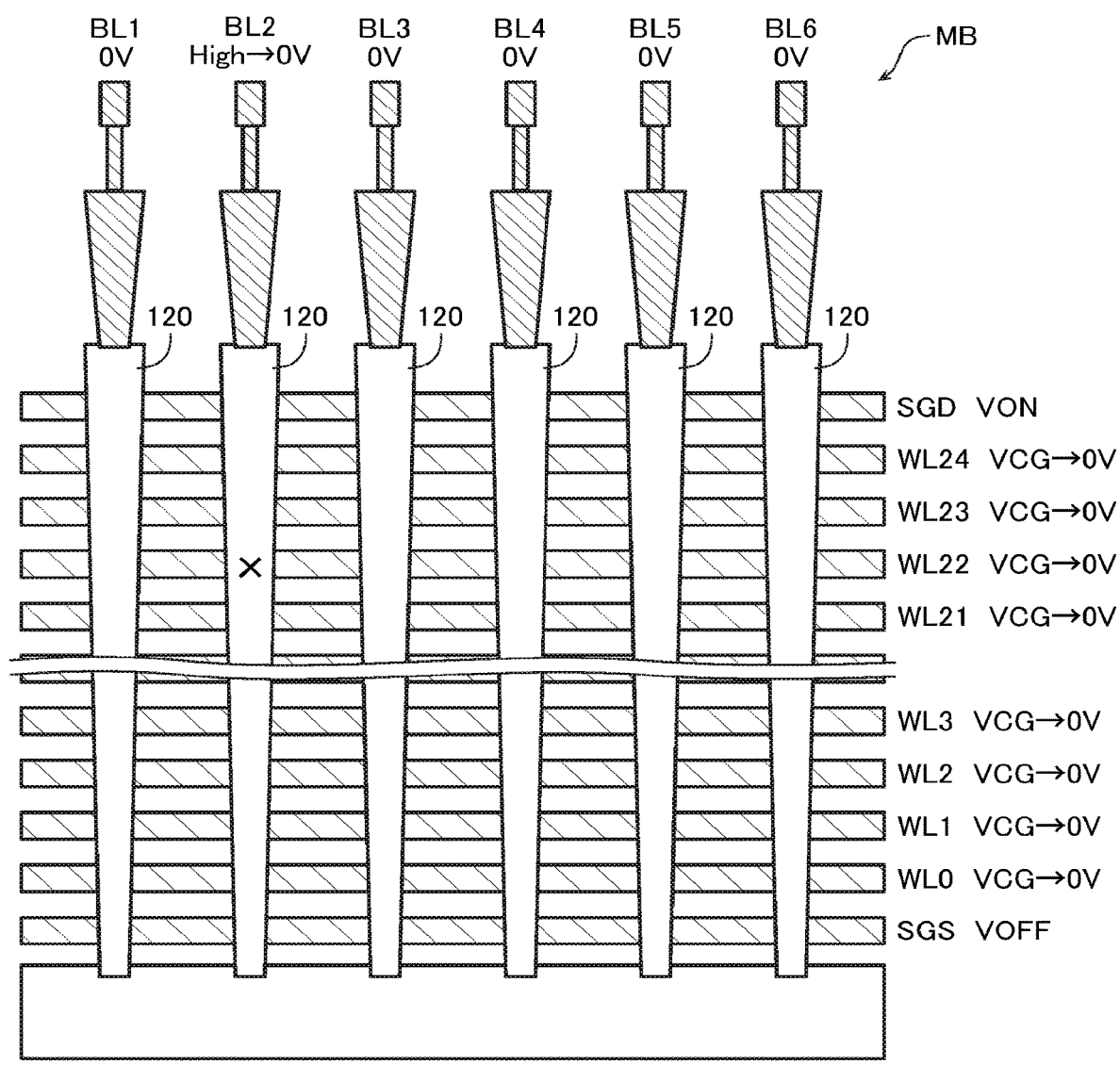
FIG. 8 is a schematic cross-sectional view for describing a defect detection method according to a second embodiment.

Next, with reference to FIG. 8, a defect detection method according to a second embodiment is described. In the following description, a configuration similar to that of the first embodiment is attached by an identical reference numeral, and therefore, similar portions will not be further elaborated.

FIG. 8 is a schematic cross-sectional view for describing the defect detection method according to the embodiment. For sake of convenient description, a part of the configuration is omitted in FIG. 8.

In the defect detection method according to the embodiment, similarly to the first embodiment, 0 V is supplied to the bit lines BL1 to BL6, the voltage VON is supplied to the drain selection line SGD, and the voltage VOFF is supplied to the source selection line SGS.

In the same method, one word line WL from the word lines WL0 to WL24 is sequentially selected to supply 0 V to the selected word line WL and supply the voltage VCG to the word lines WL other than the selected word line WL, and the voltages of the bit lines BL1 to BL6 are detected to output the result.

For example, the word line WL0 is selected to supply 0 V to the word line WL0 and supply the voltage VCG to the word lines WL1 to WL24 other than the word line WL0. For example, the address register ADR (FIG. 2) or the like is caused to latch the address data corresponding to the word line WL0 in the drawing, and the decode circuit in the row decoder RD decodes this address data to input the address data to the switch circuit. The switch circuit electrically conducts the selected word line WL0 with a first voltage supply line and electrically conducts the non-selected word lines WL with a second voltage supply line corresponding to the output signal of the decode circuit. The voltage generation circuit VG supplies 0 V to the first voltage supply line, and supplies the voltage VCG to the second voltage supply line.

Next, the voltages of the bit lines BL1 to BL6 are detected to output the result. In this case, the "L" is latched to the data latch SDL corresponding to the bit line BL2, and the "H" is latched to the data latches SDL corresponding to the other bit lines BL.

Next, the word line WL1 is selected to supply 0 V to the word line WL1 and supply the voltage VCG to the word lines WL0, WL2 to WL24 other than the word line WL1, and the voltages of the bit lines BL1 to BL6 are detected to output the result. Similarly in this case, the "L" is latched to the data latch SDL corresponding to the bit line BL2, and the "H" is latched to the data latches SDL corresponding to other bit lines BL. The similar process is performed for the word lines WL2 to WL21.

Next, the word line WL22 is selected to supply 0 V to the word line WL22 and supply the voltage VCG to the word lines WL0 to WL21, WL23, and WL24 other than the word line WL22, and the voltages of the bit lines BL1 to BL6 are detected to output the result. In this case, the current flows to the word line WL22 from the bit line BL2 via the semiconductor layer 120 to decrease the voltage of the bit line BL2 down to approximately 0 V. Accordingly, detecting the voltages of the bit lines BL1 to BL6 in this state latches the "H" to the data latches SDL corresponding to all the bit lines BL1 to BL6.

For the word lines WL23 and WL24, the similar process may be performed or may be omitted.

Next, the word line WL22 that has been selected at the timing where the data of the data latch SDL has changed from the "L" to the "H" is specified as the word line WL22 that corresponds to the defect position. At the timing where the word line WL0 and the like are selected, the bit line BL2 corresponding to the "L" is specified as the bit line BL corresponding to the defect position.

With the defect detection method according to the embodiment, using the sense amplifier SA, the above-described defect detection can be efficiently performed. Compared with the first embodiment, the position where the defect has occurred can be further easily specified.

Third Embodiment

Figure 9:
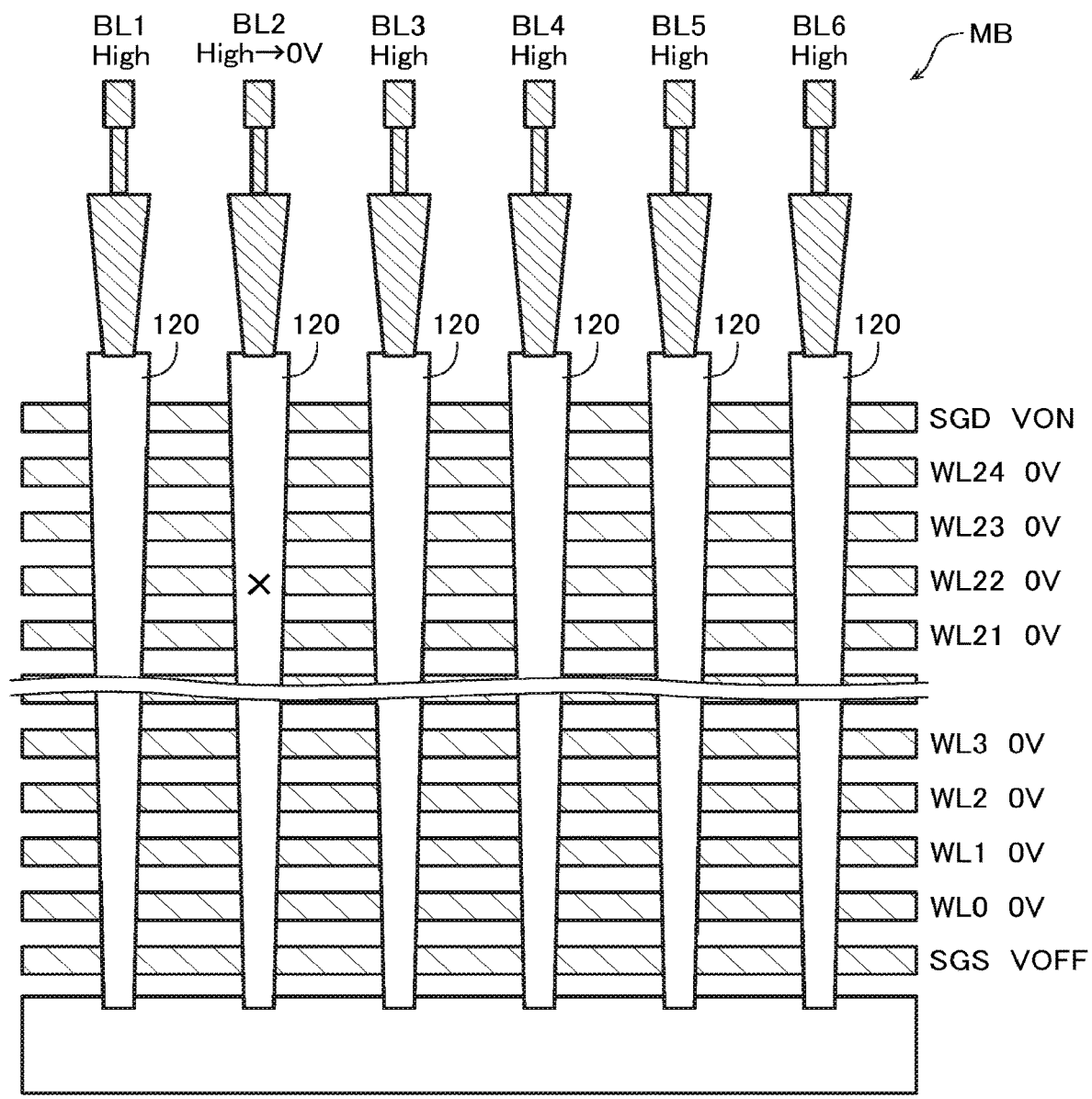
FIG. 9 is a schematic cross-sectional view for describing a defect detection method according to a third embodiment.

Next, with reference to FIG. 9, a defect detection method according to a third embodiment is described. In the following description, a configuration similar to that of the first embodiment is attached by an identical reference numeral, and therefore, similar portions will not be further elaborated.

FIG. 9 is a schematic cross-sectional view for describing the defect detection method according to the embodiment. For sake of convenient description, a part of configuration is omitted in FIG. 9.

In the defect detection method according to the embodiment, similarly to the first embodiment, the voltage VON is supplied to the drain selection line SGD and the voltage VOFF is supplied to the source selection line SGS.

In the same method, the bit lines BL1 to BL6 are charged to a predetermined voltage value, and 0 V is supplied to the word lines WL0 to WL24.

Here, in the memory block MB, when a short circuit has occurred between the word line WL and the semiconductor layer 120, the current flows to the word line WL from the bit line BL via the semiconductor layer 120 to decrease the voltage of the bit line BL. In the illustrated example, a short circuit between the word line WL22 and the semiconductor layer 120 corresponding to the bit line BL2 has occurred. This decreases the voltage of the bit line BL2.

Next, the voltages of the bit lines BL1 to BL6 are detected. In this case, the "H" is latched to the data latch SDL corresponding to the bit line BL2, and the "L" is latched to the data latches SDL corresponding to the other bit lines BL.

In the defect detection method according to the embodiment, 0 V is supplied to the word lines WL0 to WL24. Accordingly, threshold voltages of all the memory cells MC in the memory block MB are preferred to be negative voltages. Accordingly, when the defect detection method according to the embodiment is executed, an erase operation for the memory block MB may be preliminarily executed.

Fourth Embodiment

Figure 10:
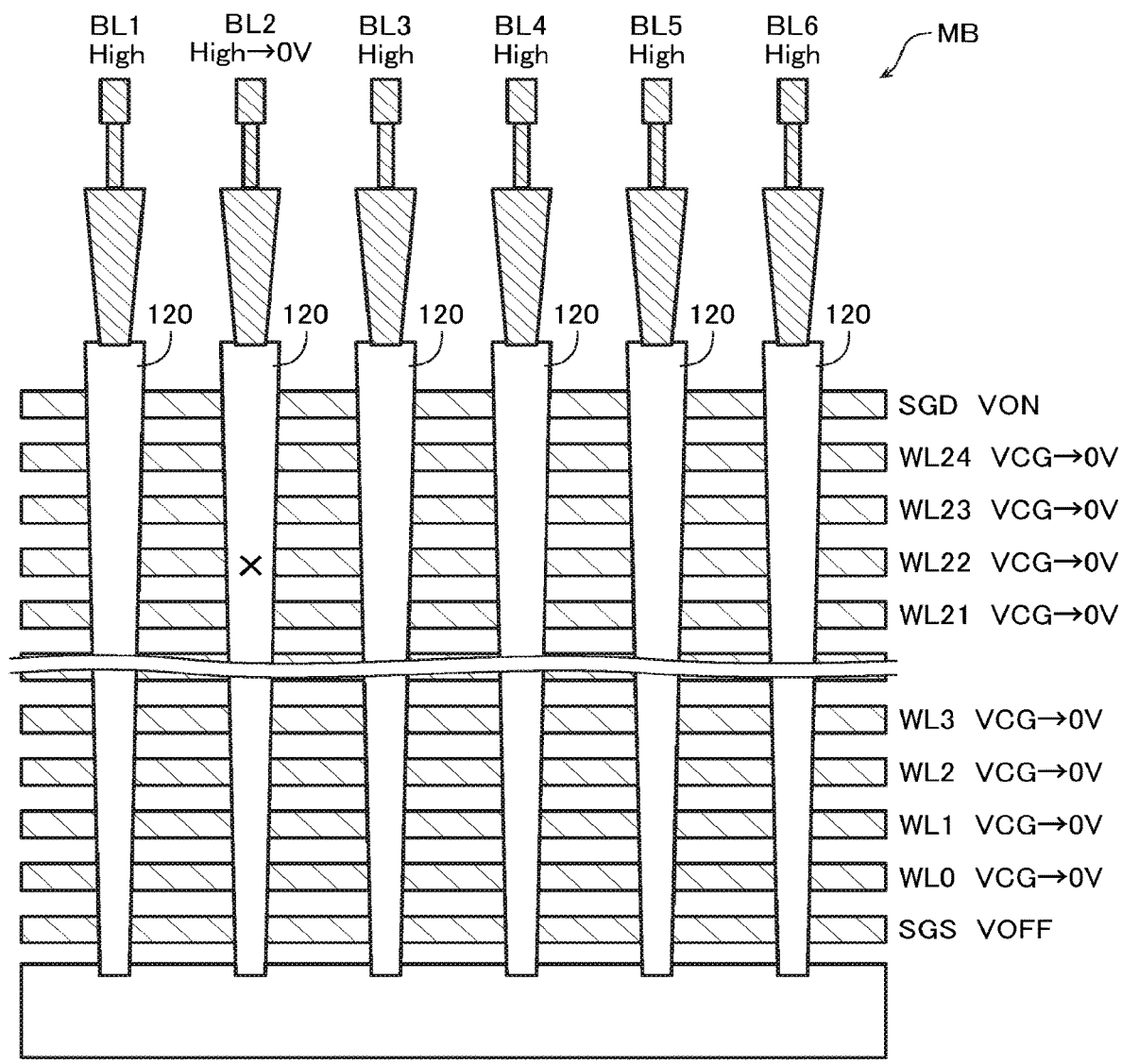
FIG. 10 is a schematic cross-sectional view for describing a defect detection method according to a fourth embodiment.

Next, with reference to FIG. 10, a defect detection method according to a fourth embodiment is described. In the following description, a configuration similar to that of the third embodiment is attached by an identical reference numeral, and therefore, similar portions will not be further elaborated.

FIG. 10 is a schematic cross-sectional view for describing the defect detection method according to the embodiment. For sake of convenient description, a part of configuration is omitted in FIG. 10.

In the defect detection method according to the embodiment, similarly to the third embodiment, the bit lines BL1 to BL6 are charged up to a predetermined voltage value, the voltage VON is supplied to the drain selection line SGD, and the voltage VOFF is supplied to the source selection line SGS.

In the same method, one word line WL is sequentially selected from the word lines WL0 to WL24 to supply 0 V to the selected word line WL and supply the voltage VCG to the word lines WL other than the selected word line WL, and the voltages of the bit lines BL1 to BL6 are detected to output the result.

For example, the word line WL0 is selected to supply 0 V to the word line WL0 and supply the voltage VCG to the word lines WL1 to WL24 other than the word line WL0, and the voltages of the bit lines BL1 to BL6 are detected to output the result. In this case, the "H" is latched to the data latches SDL that correspond to all the bit lines BL1 to BL6. The similar process is performed for the word lines WL1 to WL21.

Next, the word line WL22 is selected to supply 0 V to the word line WL22 and supply the voltage VCG to the word lines WL0 to WL21, WL23, and WL24 other than the word line WL22, and the voltages of the bit lines BL1 to BL6 are detected to output the result. In this case, the current flows to the word line WL22 from the bit line BL2 via the semiconductor layer 120 to decrease the voltage of the bit line BL2 down to approximately 0 V. Accordingly, when the voltages of the bit lines BL1 to BL6 are detected in this state, the "L" is latched to the data latch SDL corresponding to the bit line BL2 and the "H" is lathed to the data latches SDL corresponding to the other bit lines BL.

For the word lines WL23 and WL24, a similar process may be performed or may be omitted.

Next, the word line WL22 that has been selected at the timing when the data of the data latch SDL has changed from the "H" to the "L" is specified as the word line WL22 that corresponds to a defect position. At this timing, the bit line BL2 corresponding to the "L" is specified as the bit line BL corresponding to the defect position.

In the defect detection method according to the embodiment, using the sense amplifier SA, the above-described defect detection can be efficiently performed. Additionally, compared with the third embodiment, the position where the defect has occurred can be further easily specified.

Fifth Embodiment

Figure 11:
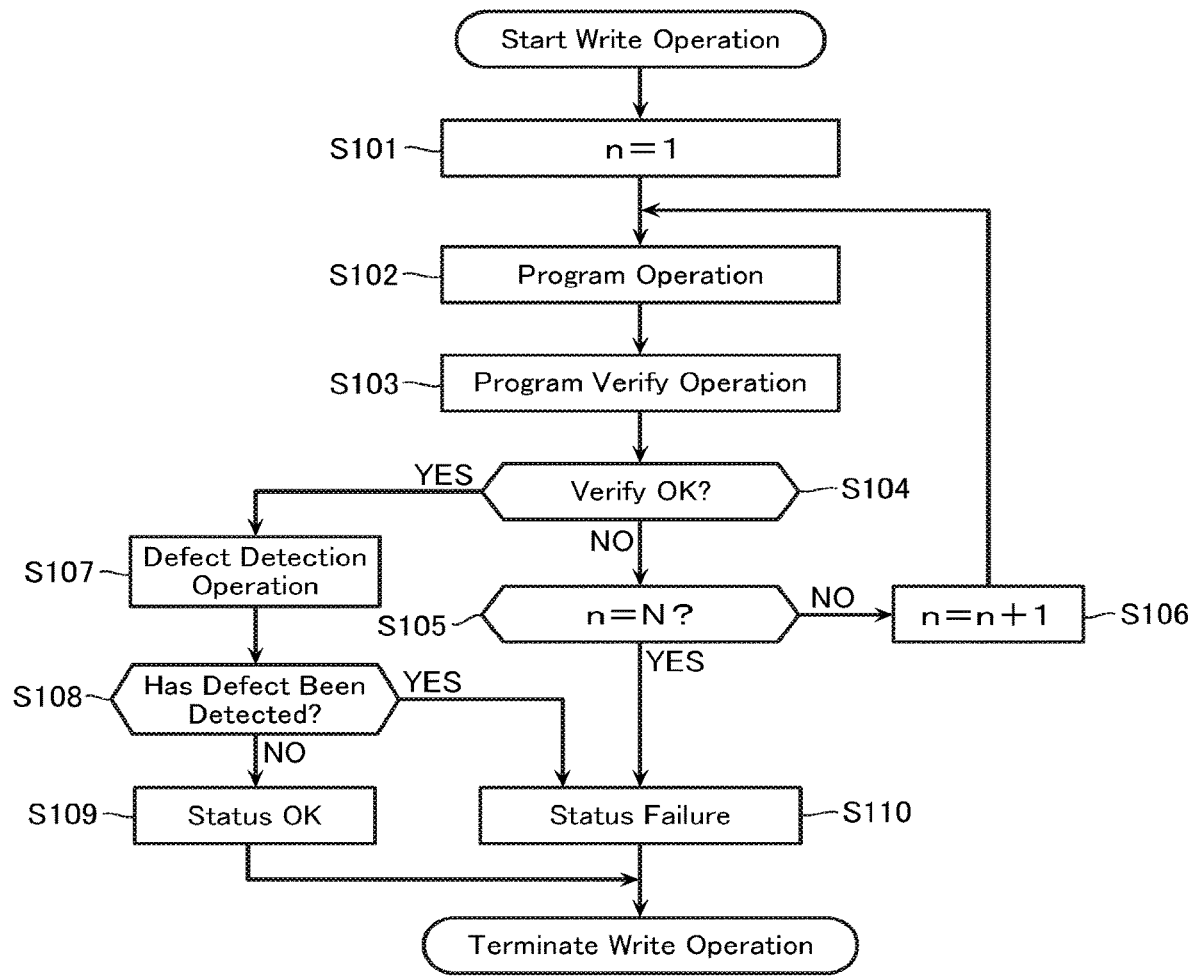
FIG. 11 is a schematic flowchart for describing a defect detection method according to a fifth embodiment.
Figure 12:
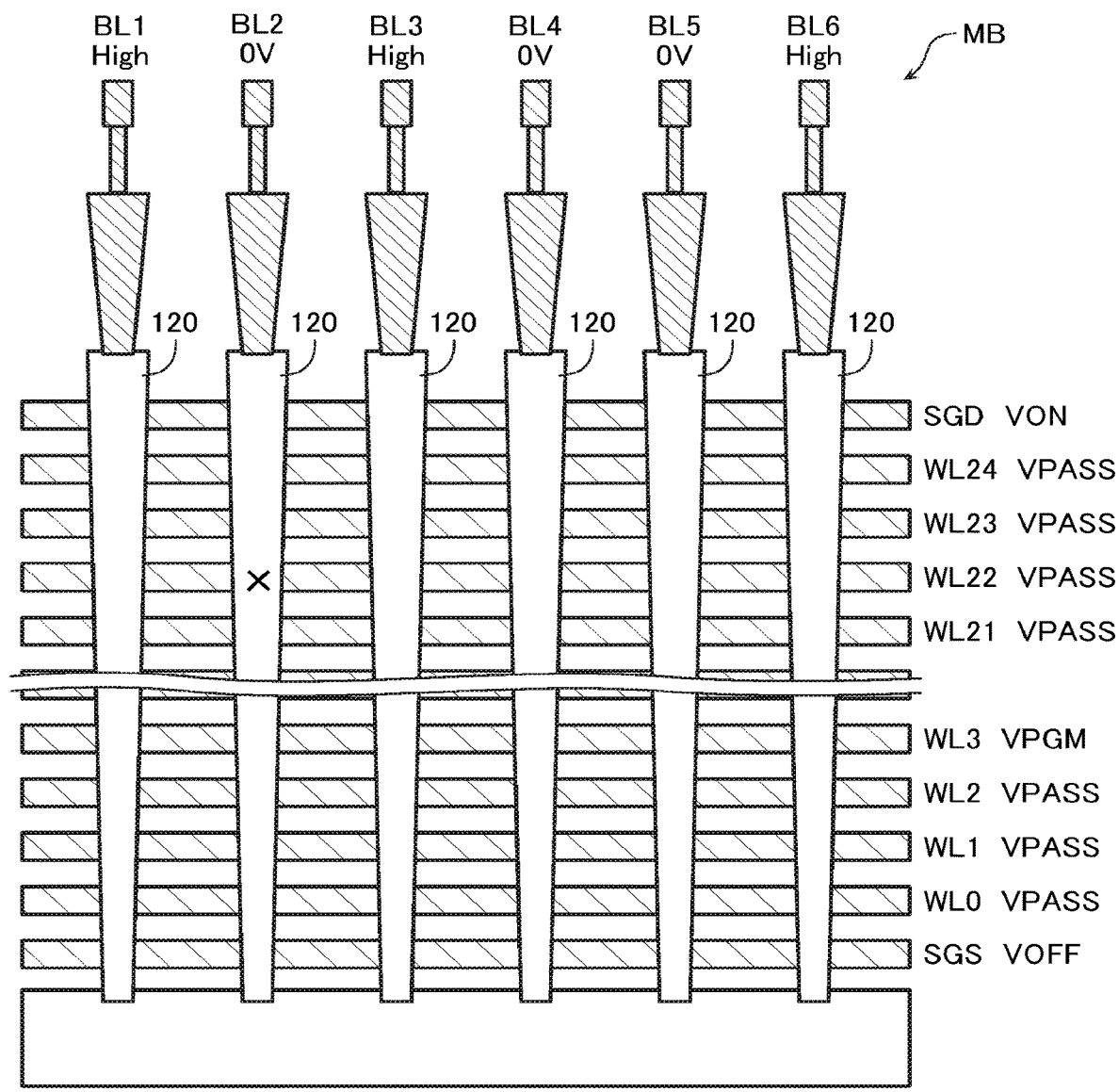
FIG. 12 is a schematic cross-sectional view for describing the same method.
Figure 13:
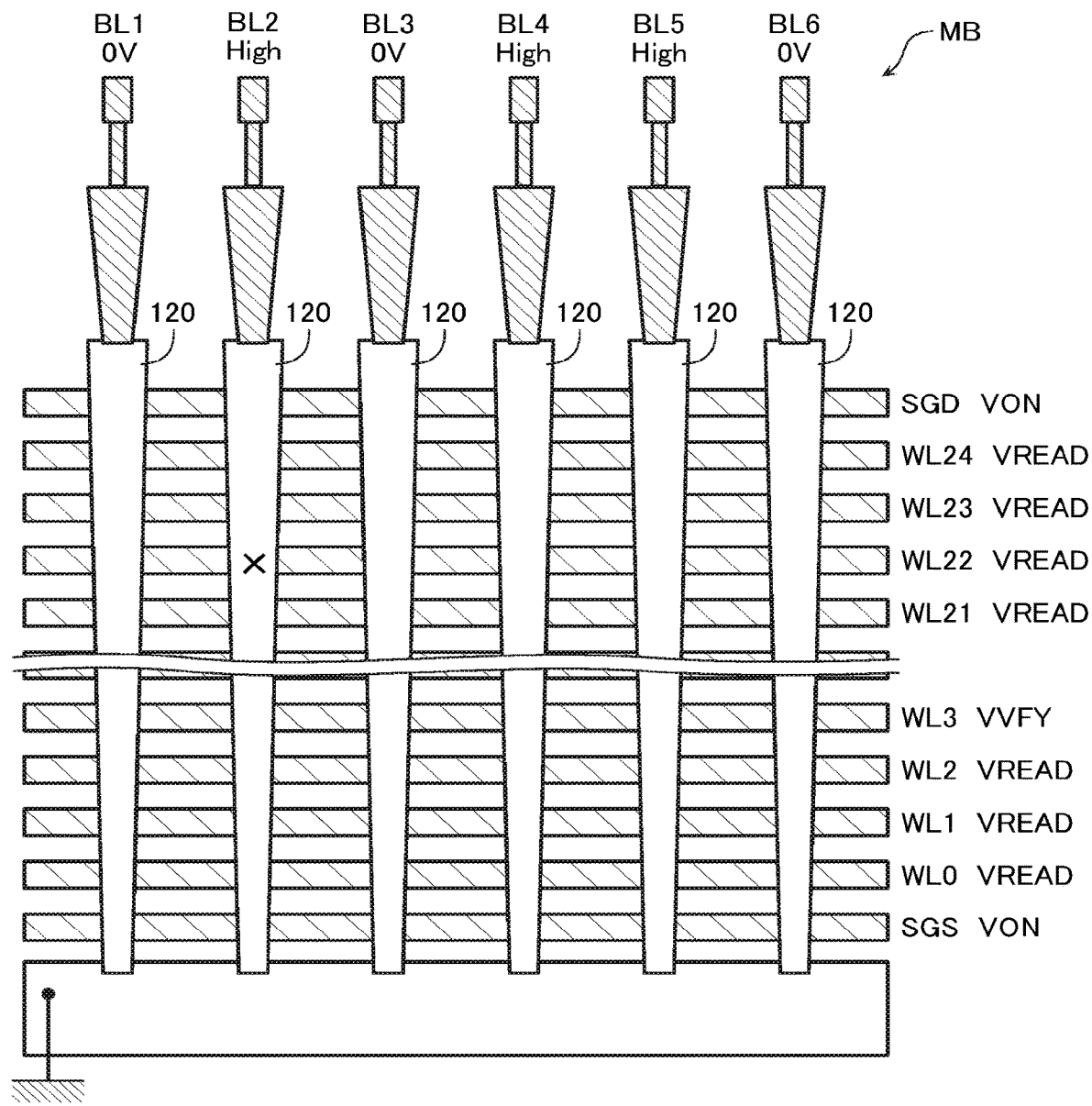
FIG. 13 is a schematic cross-sectional view for describing the same method.

Next, with reference to FIG. 11 to FIG. 13, a defect detection method according to a fifth embodiment is described. In the following description, a configuration similar to that of the first embodiment is attached by an identical reference numeral, and therefore, similar portions will not be further elaborated.

In the first embodiment to the fourth embodiment, the methods for detecting defects in a test stage when the memory die MD (FIG. 1) is manufactured has been exemplarily illustrated. However, such defect detection methods can be executed after completion of the memory system 10.

A semiconductor memory device according to the embodiment executes the defect detection method according to the first embodiment when a write operation is executed. This ensures detecting a defect that has occurred after completion of the memory system 10.

FIG. 11 is a flowchart for describing the write operation of the semiconductor memory device according to the embodiment.

At Step S101, a loop count n is set to 1. The loop count n is recorded in a register or the like.

At Step S102, a program operation is performed.

In the program operation, for example, as illustrated in FIG. 12, the bit line BL connected to the memory cell MC performing the adjustment of the threshold voltage and the bit line BL connected to the memory cell MC not performing the adjustment of the threshold voltage are supplied with the different voltages. For example, the node LAT of the data latch SDL (FIG. 4) corresponding to the former is assumed to be in the "H" state, and the node LAT of the data latch SDL corresponding to the latter is assumed to be in the "L" state. The nodes BLX, BLC, and HLL are assumed to be in the "H" state, and the node XXL is assumed to be in the "L" state. The bit line BL corresponding to the former is, for example, supplied with a ground voltage via the node N2. The bit line BL corresponding to the latter is, for example, supplied with a predetermined bit line voltage via the node N1.

The memory cell MC is electrically conducted with the bit line BL. For example, the voltage VON is supplied to the drain selection line SGD. A program voltage VPGM is supplied to the selected word line WL3, and a write pass voltage VPASS is supplied to the non-selected word lines WL. The program voltage VPGM has, for example, a magnitude to the extent that the electrons tunnel the electric charge accumulating film 132 of the memory cell MC. The write pass voltage VPASS has, for example, regardless of the data recorded in the memory cell MC, a magnitude to the extent that the memory cell MC is turned ON. The program voltage VPGM is larger than the write pass voltage VPASS.

The voltage VOFF is supplied to the source selection line SGS.

At Step S103 (FIG. 11), a program verify operation is performed.

In the program verify operation, for example, as illustrated in FIG. 13, the bit line BL connected to the memory cell MC performing the adjustment of the threshold voltage and the bit line BL connected to the memory cell MC not performing the adjustment of the threshold voltage are supplied with different voltages. For example, the node LAT of the data latch SDL (FIG. 4) corresponding to the former is assumed to be in the "L" state and the node LAT of the data latch SDL corresponding to the latter is assumed to be in the "H" state. The nodes BLX, BLC, and HLL are assumed to be in the "H" state and the node XXL is assumed to be in the "L" state. The bit line BL corresponding to the former is, for example, supplied with a predetermined bit line voltage via the node N1. The bit line BL corresponding to the latter is, for example, supplied with a ground voltage via the node N0.

0 V is supplied to the source line SL.

The memory cell MC is electrically conducted with the bit line BL and the source line SL. For example, the voltage VON is supplied to the drain selection line SGD. A read pass voltage VREAD is supplied to the non-selected word lines WL. The read pass voltage VREAD has, for example, regardless of the data recorded in the memory cell MC, a magnitude to the extent that the memory cell MC is turned ON. The read pass voltage VREAD may be smaller than the write pass voltage VPASS (FIG. 12).

A verify voltage VVFY is supplied to the selected word line WL. The verify voltage VVFY has, for example, a magnitude to the extent that the memory cell MC is turned ON or OFF corresponding to the data recorded in the memory cell MC. The verify voltage VVFY is smaller than the read pass voltage VREAD.

The voltages or the currents of the bit lines BL1 to BL6 are detected. For example, the node HLL is switched to the "L" state and the node "XXL" is switched to the "H" state to electrically conduct the gate electrode of the sense transistor 31 with the bit line BL. By turning the node "STB" into the "H" state to discharge or maintain the electric charge of the wiring LBUS and turning the node STL into the "H" state, the voltages of the bit lines BL are detected.

At Step S104 (FIG. 11), a result of the verify operation is determined. For example, when the data latched onto the data latch SDL includes the "L" or in a similar case, it is determined as a verify failure, and the step proceeds to Step S105. Meanwhile, when all the data latched onto the data latch SDL is the "H" or in a similar case, it is determined as a verify OK, and the step proceeds to Step S107.

At Step S105, it is determined whether the loop count n has reached a predetermined count N or not. When the loop count n has not reached the predetermined count N, the step proceeds to Step S106. When the loop count n has reached the predetermined count N, the step proceeds to Step S110.

At Step S106, 1 is added to the loop count n, and the step proceeds to Step S102.

At Step S107, the defect detection operation is executed. The defect detection operation is, for example, executed similarly to the defect detection method according to the first embodiment. In the defect detection operation, the voltage VCG (FIG. 7) applied to the word line WL may have, for example, a magnitude equal to or more than the read pass voltage VREAD (FIG. 13) and equal to or less than the write pass voltage VPASS (FIG. 12).

At Step S108, it is determined whether a defect has been detected or not in the defect detection operation at Step S107. When the defect has not been detected, the step proceeds to Step S109. When the defect has been detected, the step proceeds to Step S110.

At Step S109, status data of the status register STR (FIG. 2) is passed and is output to the control die CD (FIG. 1), and the write operation is terminated.

At Step S110, the status data of the status register STR (FIG. 2) is failed and is output to the control die CD (FIG. 1), and the write operation is terminated.

Sixth Embodiment

Figure 14:
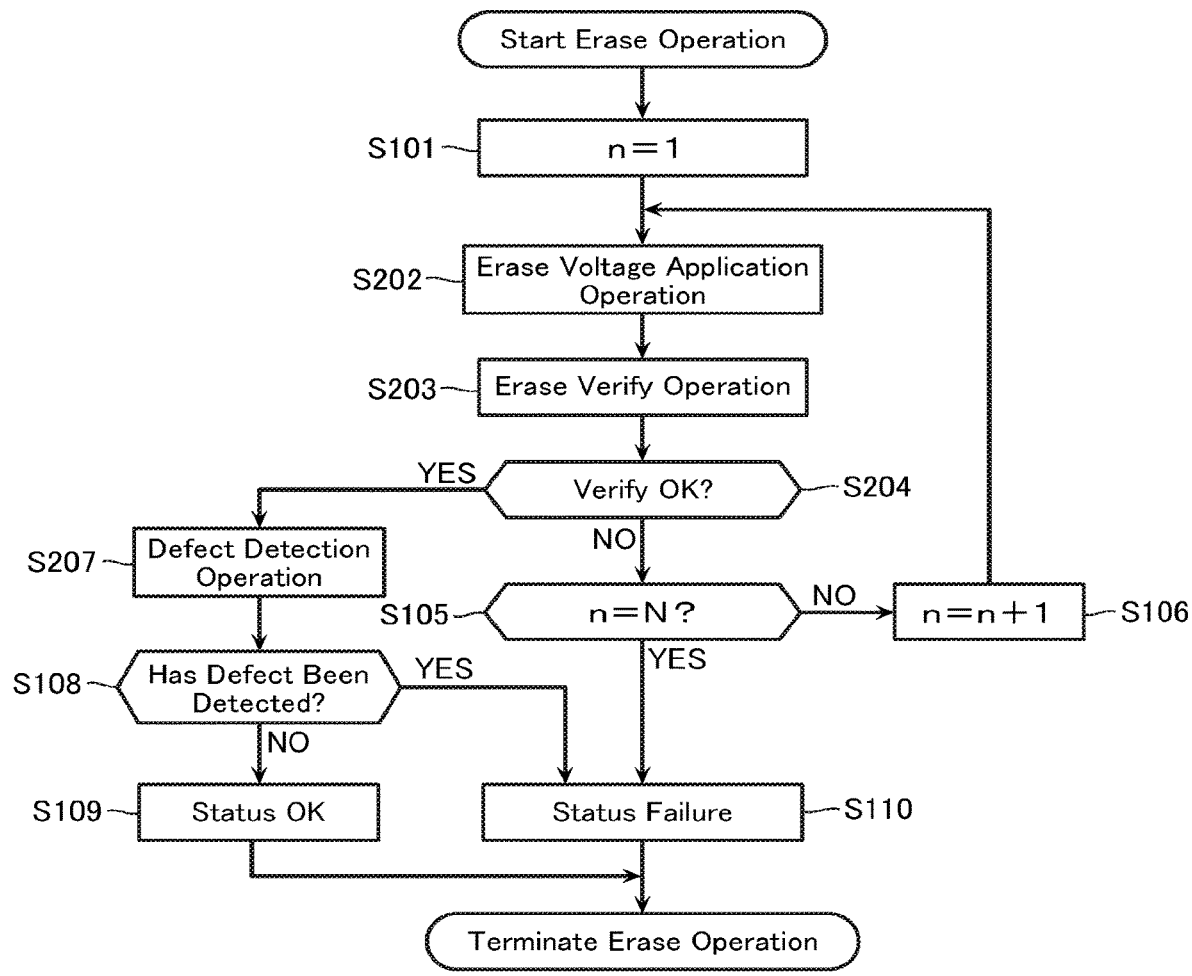
FIG. 14 is a schematic flowchart for describing a defect detection method according to a sixth embodiment.
Figure 15:
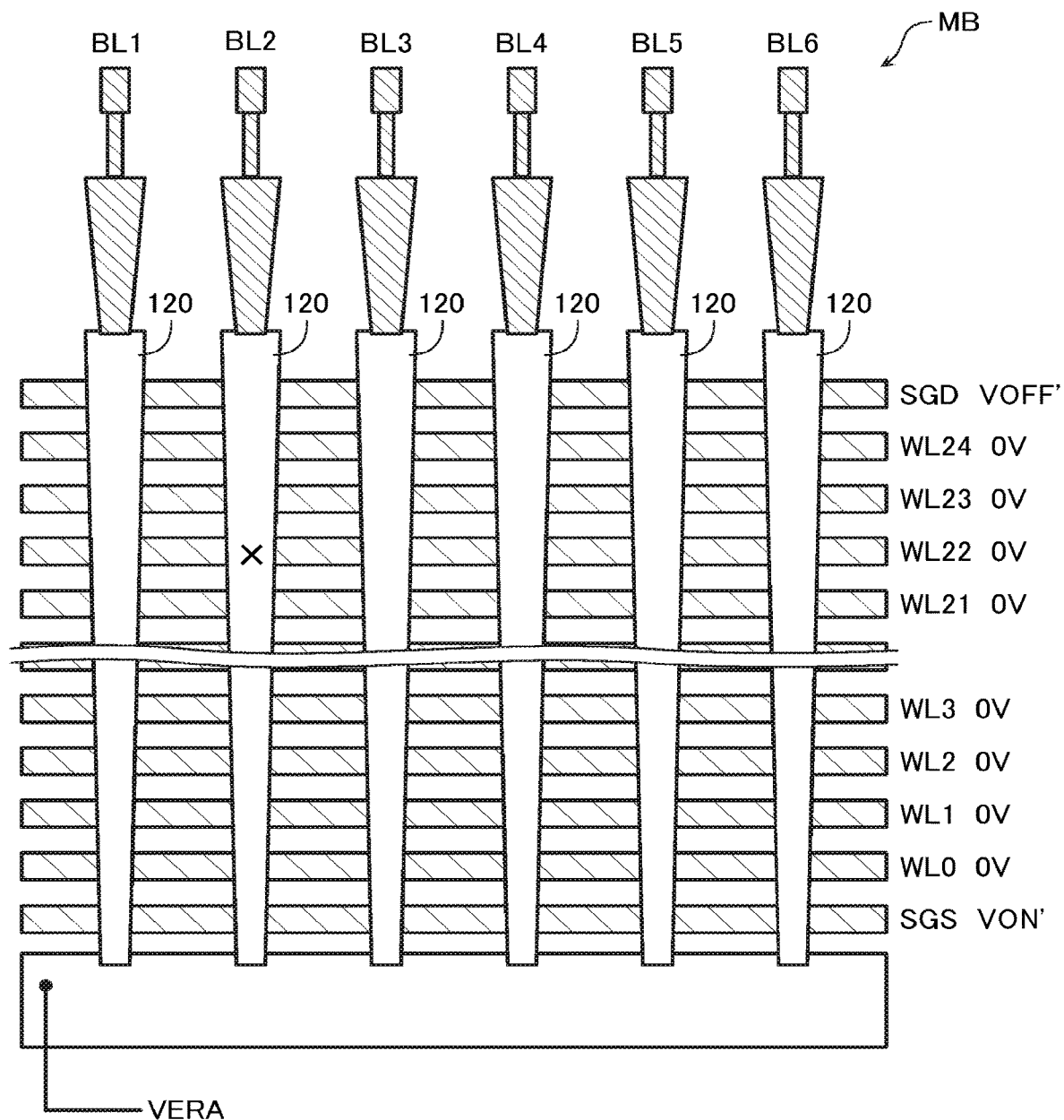
FIG. 15 is a schematic cross-sectional view for describing the same method.
Figure 16:
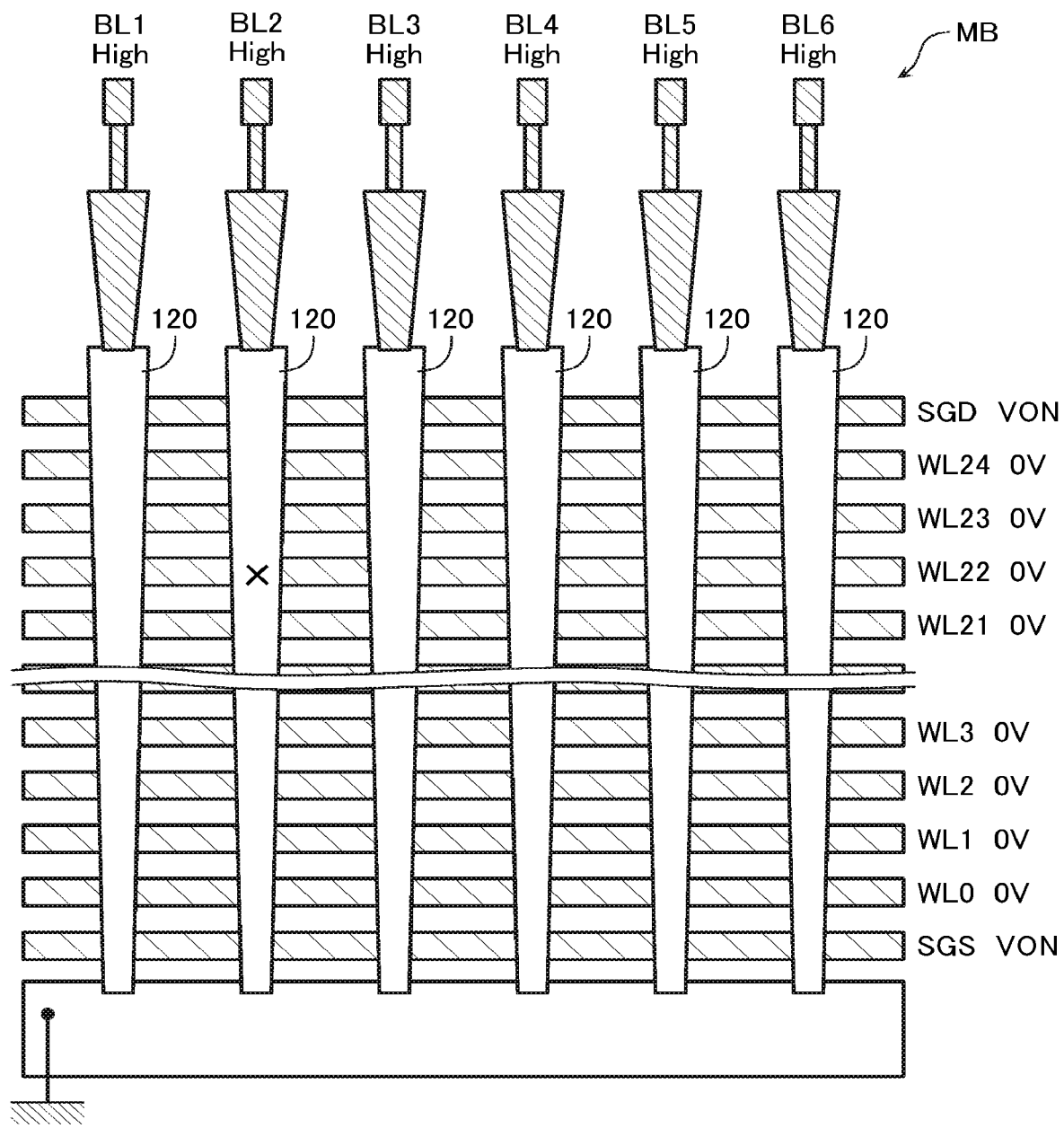
FIG. 16 is a schematic cross-sectional view for describing the same method.

Next, with reference to FIG. 14 to FIG. 16, a defect detection method according to a sixth embodiment is described. In the following description, a configuration similar to those of the first embodiment to the fifth embodiment is attached by an identical reference numeral, and therefore, similar portions will not be further elaborated.

A semiconductor memory device according to the embodiment executes the defect detection method according to the third embodiment when the erase operation is executed. This ensures detecting a defect that has occurred after completion of the memory system 10.

FIG. 14 is a flowchart for describing an erase operation of the semiconductor memory device according to the embodiment.

The erase operation of the semiconductor memory device according to the embodiment includes steps common to the write operation (FIG. 11) according to the fifth embodiment. However, in the embodiment, an erase voltage application operation (S202) is executed instead of the program operation (S102). An erase verify operation (S203) is executed instead of the program verify operation (S103). The operation at Step S204 is executed instead of the operation at Step S104. The operation at Step S207 is executed instead of the operation at Step S107.

In the erase voltage application operation at Step S202, for example, as illustrated in FIG. 15, a voltage VERA is supplied to the source line SL. The voltage VERA has, for example, a magnitude to the extent that the holes tunnel the electric charge accumulating film 132 of the memory cell MC or the electrons are pulled out from the electric charge accumulating film 132 of the memory cell MC. The voltage VERA is larger than the write pass voltage VPASS (FIG. 12).

The memory cell MC is electrically conducted with the source line SL. For example, a voltage VON' is supplied to the source selection line SGS. 0 V is supplied to the word lines WL0 to WL24. The voltage VON' has a magnitude to the extent that a channel of the holes is formed in the channel region of the source selection transistor STS.

A voltage VOFF' is supplied to the drain selection line SGD. The voltage VOFF' has a magnitude to the extent that the channel is not formed in the channel region of the drain selection transistor STD.

In the erase verify operation at Step S203, for example, as illustrated in FIG. 16, a predetermined bit line voltage is supplied to all the bit lines BL1 to BL6. 0 V is supplied to the source line SL and the word lines WL0 to WL24. The voltage VON is supplied to the drain selection lines SGD and the source selection line SGS. The voltages or the currents of the bit lines BL1 to BL6 are detected.

At Step S204 (FIG. 14), a result of the verify operation is determined. For example, when the "H" is included in the data latched onto the data latch SDL or in a similar case, it is determined as a verify failure, and the step proceeds to Step S105. Meanwhile, when all the data latched onto the data latch SDL is the "L" or in a similar case, it is determined as a verify OK, and the step proceeds to Step S207.

At Step S207, the defect detection operation is executed. The defect detection operation is, for example, executed similarly to the defect detection method according to the third embodiment.

Seventh Embodiment

In the first embodiment to the sixth embodiment, some defect detection methods have been exemplarily illustrated. Here, when a defect is detected, the control die CD (control device) can perform a management or the like of the defective block. The following exemplarily illustrates such a management method.

Figure 17:
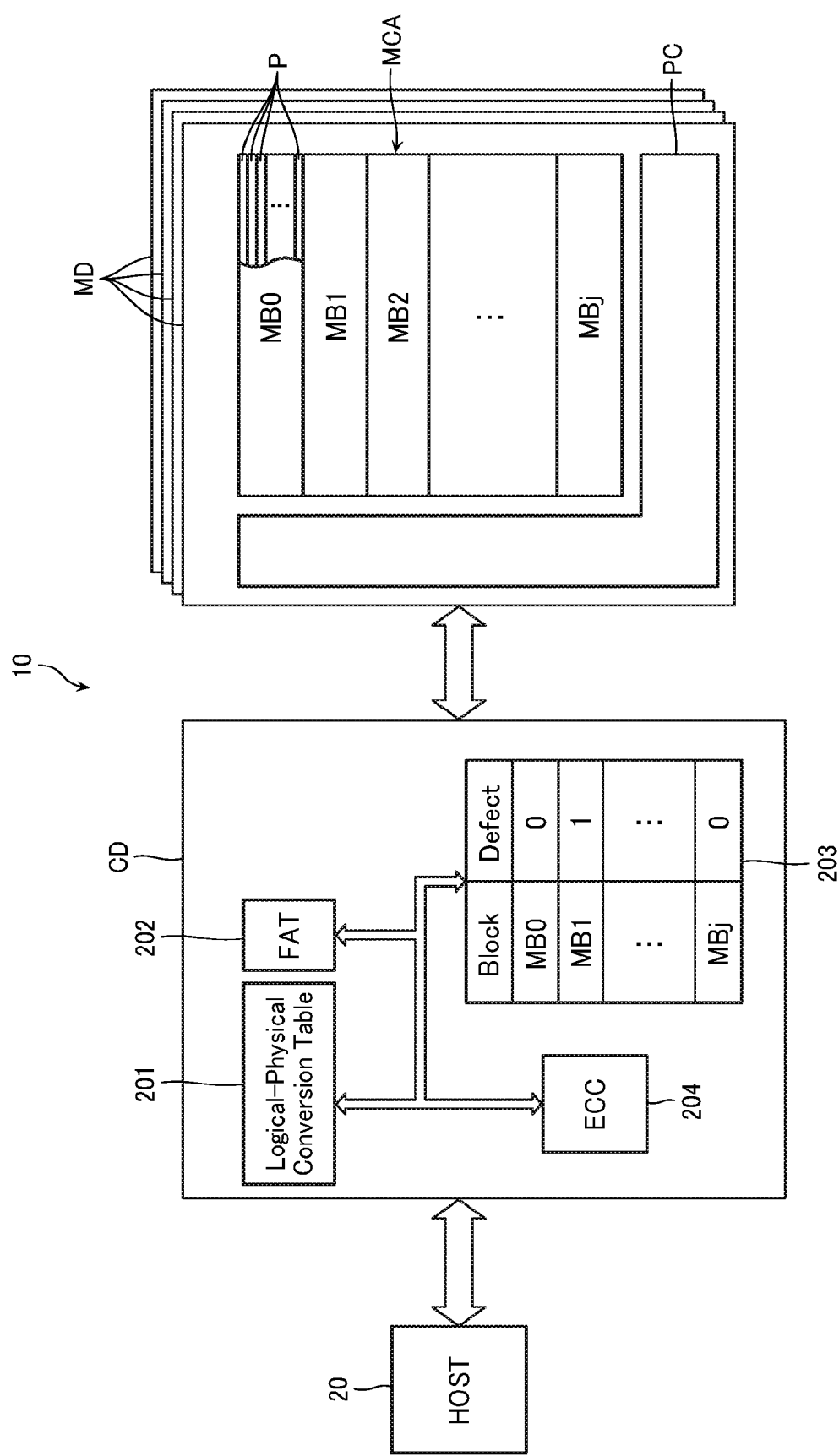
FIG. 17 is a schematic block diagram illustrating a configuration of the memory system 10.

As illustrated in FIG. 17, the control die CD according to the embodiment achieves a logical-physical conversion table 201, a File Allocation Table (FAT) 202, a defective block table 203, and the like by a processor, a RAM, a ROM, and the like. The control die CD according to the embodiment includes an ECC circuit 204.

The logical-physical conversion table 201 correlates a logical address received from the host computer 20 with a physical address allocated to respective pages P of the memory cell array MCA, and latches them.

The FAT 202 latches FAT information indicating states of the respective pages P. Such FAT information includes, for example, information indicative of "valid", "invalid", and "erased". For example, a "valid" page P stores valid data that is read corresponding to an instruction from the host computer 20. An "invalid" page P stores invalid data that is not read corresponding to an instruction from the host computer 20. An "erased" page P stores no data since the erase operation has been executed.

The defective block table 203 correlates the physical address corresponding to the memory blocks MB0 to MBj with information indicative of whether the memory blocks MB0 to MBj are defective blocks or not, and latch them.

The ECC circuit 204 detects errors in data read from the memory die MD, and corrects the data when it is possible.

[Operation]

Next, an operation of a semiconductor memory device including the memory die MD and the control die CD as described above is described.

[Initial Operation]

The control die CD obtains, for example, a physical address and the like of the defective block by referring to the data recorded in the ROM regions (FIG. 2) of the memory cell arrays MCA of the respective memory dies MD as an initial operation. Next, by referring to the defective block table 203, information that the memory block MB corresponding to the obtained physical address is a defective block is recorded.

[Read Sequence]

The control die CD executes, for example, a read sequence corresponding to a read instruction from the host computer 20. For example, first, by referring to the logical-physical conversion table 201, the physical address corresponding to the logical address received from the host computer 20 is obtained. Next, the obtained physical address and the read instruction are transmitted to the memory die MD, and the read operation is executed. Next, data is received from the memory die MD and is transmitted to the ECC circuit 204 to detect errors and correct the data, and the data is transmitted to the host computer 20.

[Write Sequence]

The control die CD executes, for example, the write sequence corresponding to a write instruction from the host computer 20. For example, first, an allocation process that allocates a physical address to the received logical address is executed to obtain the physical address. Next, the obtained physical address, the write instruction, and the data received from the host computer 20 are transmitted to the memory die MD, and, for example, as described with reference to FIG. 11 to FIG. 13, the write operation is executed.

In the allocation process, for example, first, the logical-physical conversion table 201 is referred to determine whether the received logical address is latched or not. When the logical address is latched, this logical address and the physical address corresponding to this are erased from the logical-physical conversion table 201. By referring to the FAT 202, the FAT information corresponding to the erased physical address is turned to "invalid". Next, a physical address of the page P that has a status of "erased" is obtained from the FAT 202. Next, by referring to the defective block table 203, it is determined whether the memory block MB corresponding to the obtained physical address is the block corresponding to the defective block or not. When the memory block MB is not the defective block, the obtained physical address and the received logical address are written into the logical-physical conversion table 201. When the memory block MB is the defective block, the FAT 202 is referred again to obtain the physical address.

The control die CD, next, receives status data from the memory die MD, and determines whether the status data is failed or passed. When the status data is failed, by referring to the defective block table 203, information that the memory block MB corresponding to the physical address transmitted to the memory die MD is a defective block is recorded.

[Erase Sequence]

The control die CD, for example, when the number of the memory blocks MB which includes pages P having a status of "erased" becomes equal to or less than a certain number, when an erase instruction is received from the host computer 20, and in a similar case, executes an erase sequence. For example, first, the FAT 202 is referred to detect a memory block MBi with the states of all the pages P being "invalid", and the physical address corresponding to this memory blocks MBi is obtained. Next, the obtained physical address and the erase instruction are transmitted to the memory die MD, and, for example, as described with reference to FIG. 14 to FIG. 16, the erase operation is executed.

The control die CD, next, receives the status data from the memory die MD to determine whether the status data is failed or passed. When the status data is failed, by referring to the defective block table 203, information that the memory block MB corresponding to the physical address transmitted to the memory die MD is a defective block is recorded.

In the example described above, the example that, when the defect position is specified, manages this defect position as a defective block in a unit of memory block MB has been described. However, when the defect position is specified, for example, this defect position may be managed in a unit of bit line BL or may be managed in a unit of page P.

When the defect position is managed in a unit of bit line BL, the memory die MD may directly output the result of detected current or voltage by the sense amplifier SA to the control die CD. The control die CD, for example, may replace the bit corresponding to the defect position with the redundant bit or the like for the ECC process or the like.

When the defect position is managed in a unit of page P, the memory die MD, for example, may execute the defect detection operation (FIG. 11) at Step S107 of the write operation in a way similar to the defect detection method according to the second embodiment. For example, the defect detection operation (FIG. 14) at Step S207 of the erase operation may be executed in a way similar to the defect detection method according to the fourth embodiment. The memory die MD may output address information corresponding to the word line WL selected at the timing when a defect is detected to the control die CD.

[Other]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A defect detection method for a semiconductor memory device, wherein the semiconductor memory device includes a first wiring and a second wiring, a memory transistor connected between the first wiring and the second wiring, a first selection transistor connected between the first wiring and the memory transistor, a second selection transistor connected between the second wiring and the memory transistor, a third wiring connected to a gate electrode of the first selection transistor, and a fourth wiring connected to a gate electrode of the second selection transistor, the defect detection method comprising:

from a first timing to a second timing, supplying a first voltage that turns the first selection transistor ON to the third wiring, and not supplying a second voltage that turns the first selection transistor OFF to the third wiring;

from the first timing to the second timing, not supplying a third voltage that turns the second selection transistor ON to the fourth wiring, and supplying a fourth voltage that turns the second selection transistor OFF to the fourth wiring;

from the second timing to a third timing, not supplying the first voltage to the third wiring, and supplying the second voltage to the third wiring; and at a fourth timing between the first timing and the third timing, detecting at least one of a voltage and a current of the first wiring.

2. The defect detection method for the semiconductor memory device according to claim 1, wherein
the semiconductor memory device includes a fifth wiring connected to a gate electrode of the memory transistor, and
the defect detection method further comprises supplying a potential difference to the first wiring and the fifth wiring at a predetermined timing between the first timing and the second timing.

3. The defect detection method for the semiconductor memory device according to claim 1, wherein the semiconductor memory device further includes a sense transistor including a gate electrode connected to the first wiring, a latch circuit connected to the sense transistor, a switch transistor connected between the sense transistor and the latch circuit, and a sixth wiring connected to a gate electrode of the switch transistor, and
the defect detection method further comprises supplying a fifth voltage that turns the switch transistor ON to the sixth wiring at the fourth timing.

4. The defect detection method for the semiconductor memory device according to claim 1, wherein the semiconductor memory device includes a plurality of the memory transistors connected between the first selection transistor and the second selection transistor, and a plurality of fifth wirings connected to respective gate electrodes of the plurality of memory transistors, and
the defect detection method further comprises supplying a sixth voltage to a plurality of the fifth wirings at a predetermined timing between the first timing and the second timing.

5. The defect detection method for the semiconductor memory device according to claim 1, wherein the semiconductor memory device includes a plurality of the memory transistors connected between the first selection transistor and the second selection transistor, and a plurality of fifth wirings connected to respective gate electrodes of the plurality of memory transistors, and
the defect detection method further comprises:
supplying a seventh voltage to a plurality of the fifth wirings;
repeatedly performing a process that selects one of the fifth wirings from the plurality of fifth wirings, a process that switches a voltage of the selected fifth wiring to an eighth voltage different from the seventh voltage, and a process that detects at least one of a voltage and a current of the first wiring; and
outputting information configured to specify the fifth wiring corresponding to a timing at which the at least one of the voltage and the current of the first wiring detected has changed.

6. The defect detection method for the semiconductor memory device according to claim 1, wherein the semiconductor memory device includes a plurality of the first wirings, a plurality of the memory transistors connected between the plurality of first wirings and the second wiring, a plurality of first selection transistors connected between the plurality of first wirings and the plurality of memory transistors, and a plurality of second selection transistors connected between the second wiring and the plurality of memory transistors,
the third wiring is commonly connected to gate electrodes of the plurality of first selection transistors,
the fourth wiring is commonly connected to gate electrodes of the plurality of second selection transistors,
the defect detection method further comprises detecting, at the fourth timing, at least one of voltages and currents of the plurality of first wirings, and
the defect detection method further comprises outputting information corresponding to the at least one of the voltages and the currents of the plurality of first wirings detected.

* * * * *